United States Patent
Chen et al.

(10) Patent No.: US 10,873,331 B2
(45) Date of Patent: Dec. 22, 2020

(54) CLAMP LOGIC CIRCUIT

(71) Applicant: RichWave Technology Corp., Taipei (TW)

(72) Inventors: Chih-Sheng Chen, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 229 days.

(21) Appl. No.: 16/102,685

(22) Filed: Aug. 13, 2018

(65) Prior Publication Data

US 2019/0068195 A1  Feb. 28, 2019

Related U.S. Application Data

(60) Provisional application No. 62/549,968, filed on Aug. 25, 2017.

(51) Int. Cl.
| | | |
|---|---|---|
| *H03K 19/094* | (2006.01) | |
| *H02H 9/02* | (2006.01) | |
| *H03K 19/173* | (2006.01) | |
| *H03H 17/02* | (2006.01) | |
| *H03K 19/0175* | (2006.01) | |

(52) U.S. Cl.
CPC ......... *H03K 19/09403* (2013.01); *H02H 9/02* (2013.01); *H03H 17/0248* (2013.01); *H03K 19/0175* (2013.01); *H03K 19/09429* (2013.01); *H03K 19/1733* (2013.01); *H03K 2217/0036* (2013.01)

(58) Field of Classification Search
CPC .... H02H 9/02; H02H 9/025; H03K 19/09429; H03K 19/0175; H03K 19/1733; H03H 2217/0036; H03H 19/0175; H03H 17/0248

See application file for complete search history.

(56) References Cited

U.S. PATENT DOCUMENTS

| | | | |
|---|---|---|---|
| 4,785,229 A * | 11/1988 | Edwards ................. | G05F 1/571 307/39 |
| 5,446,406 A * | 8/1995 | Gantioler ............. | H03K 17/063 327/427 |
| 7,741,882 B1 | 6/2010 | Ray | |
| 8,164,364 B2 | 4/2012 | Doorenbos | |
| 8,854,087 B2 | 10/2014 | Peters | |
| 8,975,931 B2 | 3/2015 | Koehler | |

(Continued)

FOREIGN PATENT DOCUMENTS

| | | |
|---|---|---|
| CN | 102645952 A | 8/2012 |
| JP | 3-145918 A | 6/1991 |

(Continued)

*Primary Examiner* — Jue Zhang
*Assistant Examiner* — Trinh Q Dang
(74) *Attorney, Agent, or Firm* — Winston Hsu

(57) ABSTRACT

A clamp logic circuit has a logic circuit, a control terminal, a current clamp circuit and an output terminal. The logic circuit has at least a junction field-effect transistor (JFET). The control terminal receives an input signal. The current clamp circuit has a transistor and a resistor. A first end of the transistor is coupled to the control terminal, a second end of the transistor is coupled to a first end of the resistor, a control end of the transistor is coupled to a reference voltage, and a second end of the resistor is coupled to an input end of the logic circuit. The output terminal is coupled to an output end of the logic circuit.

20 Claims, 11 Drawing Sheets

(56) References Cited

U.S. PATENT DOCUMENTS

| | | | |
|---|---|---|---|
| 9,088,159 B2 | 7/2015 | Peuser | |
| 2007/0236274 A1* | 10/2007 | Huang | H03K 17/102 327/427 |
| 2012/0206193 A1 | 8/2012 | Sugiura | |
| 2012/0223770 A1* | 9/2012 | Muza | H04R 19/005 327/581 |
| 2015/0030177 A1* | 1/2015 | Wang | H04R 29/001 381/74 |
| 2015/0207475 A1* | 7/2015 | Roy | H03F 3/195 330/278 |
| 2016/0268903 A1* | 9/2016 | Miyaki | H02M 3/158 |
| 2017/0040823 A1* | 2/2017 | Sunada | H03K 17/689 |

FOREIGN PATENT DOCUMENTS

| | | |
|---|---|---|
| JP | 2008-26123 A | 2/2008 |
| JP | 4671927 | 4/2011 |

\* cited by examiner

US 10,873,331 B2

CLAMP LOGIC CIRCUIT

CROSS REFERENCE TO RELATED APPLICATION

This application claims the benefit of U.S. Provisional Application No. 62/549,968, filed on Aug. 25, 2017, the contents of which are incorporated herein in their entirety.

TECHNICAL FIELD

The present invention relates generally to a clamp logic circuit, and more specifically pertains to a clamp logic circuit for high frequency radio frequency (RF) applications.

BACKGROUND

As the semiconductor process progresses, the electronic components (e.g., transistors) become smaller, causing the signals of the electronic components easily affected by external radio frequency (RF) signals. Please refer to FIG. 1A. FIG. 1A is a functional block diagram of a logic circuit 100 according to the prior art. An input signal S1 is inputted to the logic circuit 100 via an input terminal A. A parasitic capacitor Cp1 exists between the logic circuit 100 and an external RF device (e.g., an RF chip), and an external alternating current (AC) signal Sr (e.g., an RF signal) from the external RF device may be transmitted to the input terminal A via the parasitic capacitor Cp1. As a result, the logic circuit 100 may operate abnormally due to the interference of the external AC signal Sr. For example, transition of a logic level of an output terminal B (e.g., from a high level to a low level or from the low level to the high level) of the logic circuit 100 may be abnormal. Moreover, the logic circuit 100 may consume a lot of power due to the electronic characteristics of the logic circuit 100. Please refer to FIG. 1B. FIG. 1B is a relationship diagram of a current I flowing from the input terminal A into the logic circuit 100 versus a voltage level of the input signal S1. When the voltage level of the input signal S1 is greater than 1 volt, the current that flows from the input terminal A into the logic circuit 100 increases as the potential of the input signal S1 increases, causing the logic circuit 100 to consume excessive electric power.

SUMMARY

In an embodiment of the present invention, a clamp logic circuit is provided. The clamp logic circuit comprises a logic circuit, a control terminal, a current clamp circuit and an output terminal. The logic circuit comprises at least a junction field-effect transistor (JFET). The control terminal is configured to receive an input signal. The current clamp circuit comprises a transistor and a resistor. A first end of the transistor is coupled to the control terminal, a second end of the transistor is coupled to a first end of the resistor, a control end of the transistor is coupled to a reference voltage, and a second end of the resistor is coupled to an input end of the logic circuit. The output terminal is coupled to an output end of the logic circuit.

DETAILED DESCRIPTION

Figure 1A:
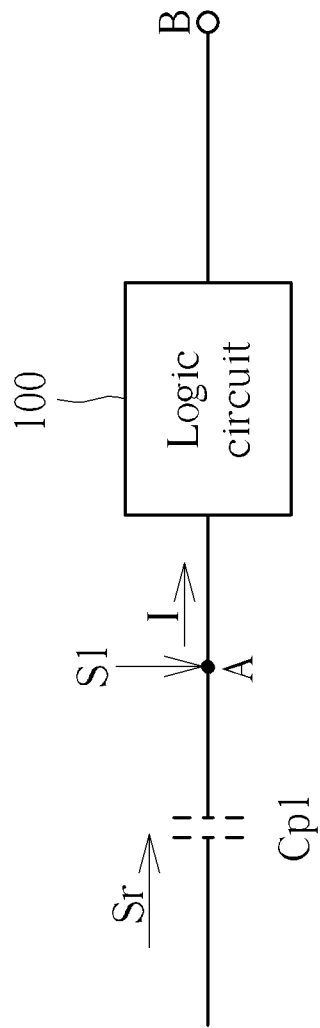
FIG. 1A is a functional block diagram of a logic circuit according to the prior art.
Figure 1B:
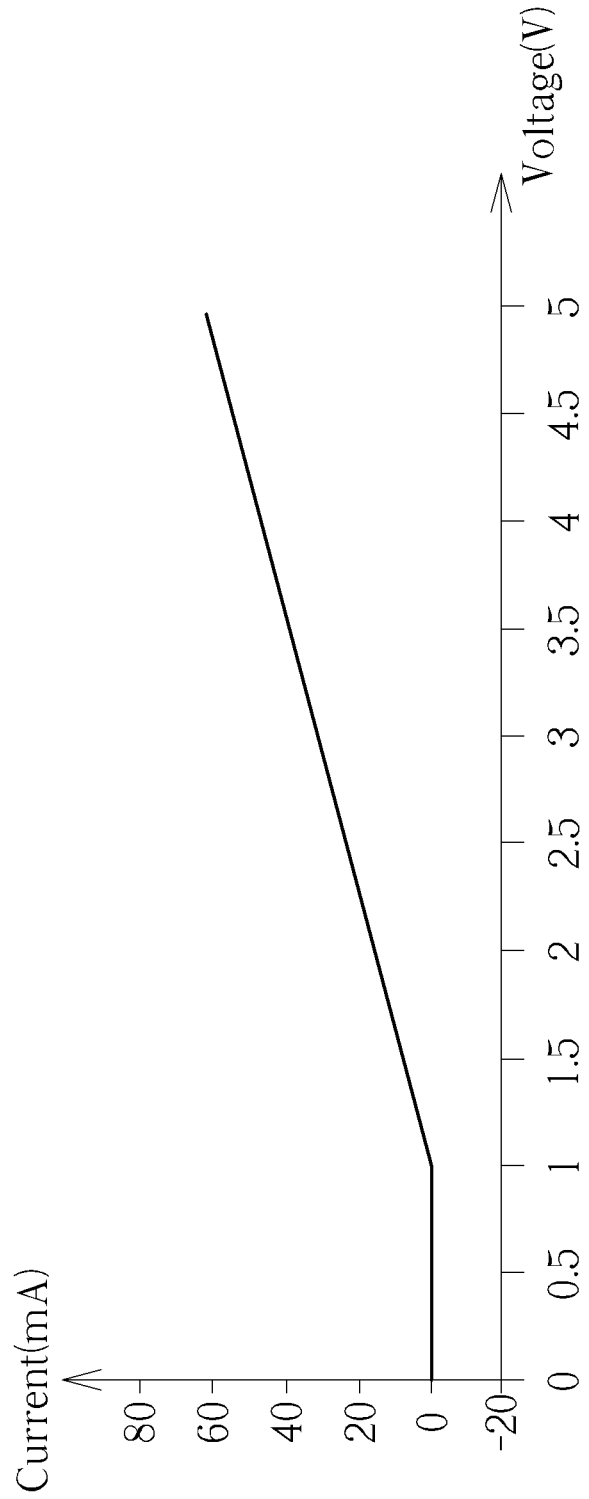
FIG. 1B is a relationship diagram of a current flowing from the input terminal into the logic circuit shown in FIG. 1A versus a voltage level of an input signal.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2A:
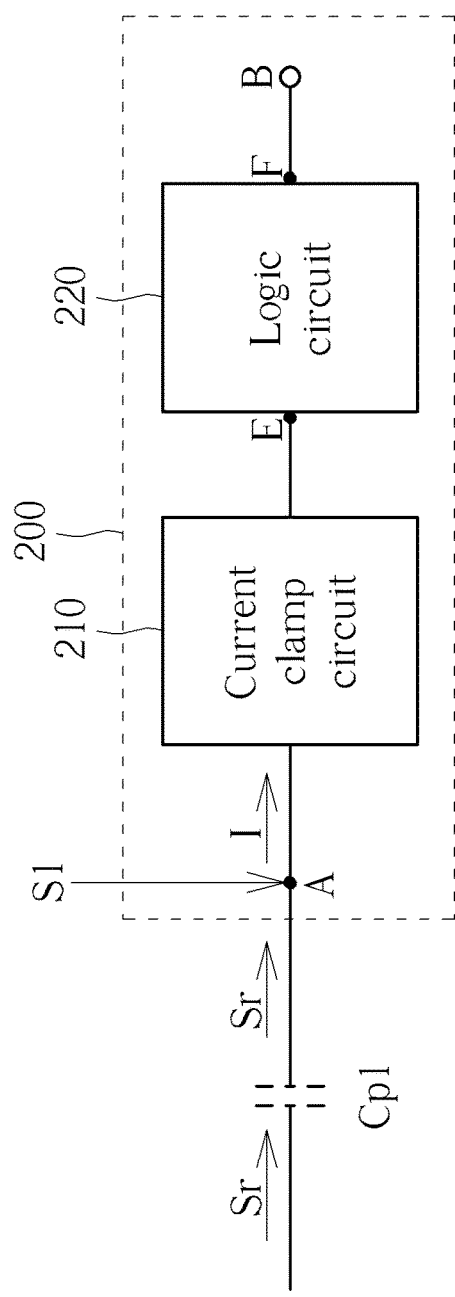
FIG. 2A is a functional block diagram of a clamp logic circuit according to an embodiment of the present invention.
Figure 2B:
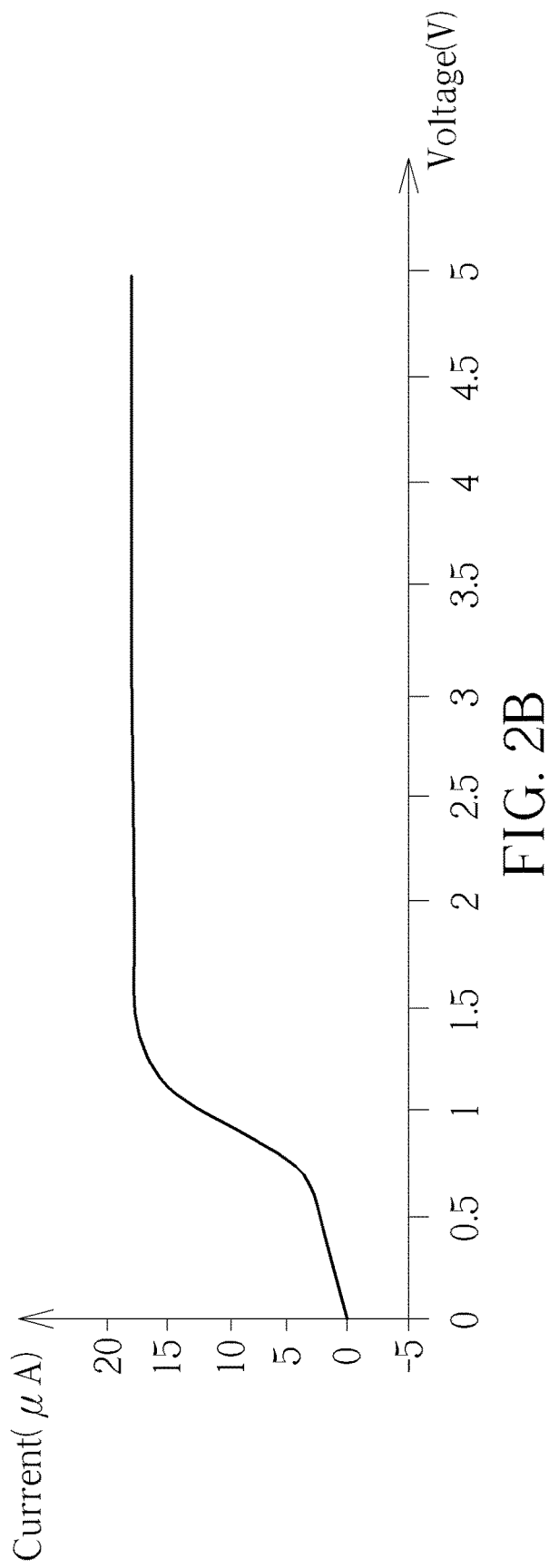
FIG. 2B is a relationship diagram of a current flowing from the control terminal into the current clamp circuit of the clamp logic circuit shown in FIG. 2A versus a voltage level of an input signal.

Please refer to FIG. 2A. FIG. 2A is a functional block diagram of a clamp logic circuit 200 according to an embodiment of the present invention. The clamp logic circuit 200 comprises an input terminal A, a current clamp circuit 210, a logic circuit 220 and an output terminal B. The input terminal A is used as a control terminal of the clamp logic circuit 200 and is configured to receive an input signal S1. The input signal S1 may be a direct-current (DC) voltage signal or a digital signal. An input end E of the logic circuit 220 is coupled to the current clamp circuit 210, and an output end F of the logic circuit 220 is coupled to the output terminal B of the clamp logic circuit 200. In addition, a parasitic capacitor Cp1 exists between the clamp logic circuit 200 and an external RF device, and an external AC signal Sr from the external RF device is transmitted to the control terminal A via the parasitic capacitor Cp1. In the case of direct current (DC) analysis, the current clamp circuit 210 is used to clamp a current I flowing from the control terminal A into the current clamp circuit 210. Due to the current clamp circuit 210, a maximum current flowing from the control terminal A into the clamp logic circuit 200 is limited. Please refer to FIG. 2B. FIG. 2B is a relationship diagram of a current I flowing from the control terminal A into the current clamp circuit of the clamp logic circuit 200 versus a voltage level of the input signal S1. As shown in FIG. 2B, the maximum current flowing from the control terminal A into the clamp logic circuit 200 does not exceed a maximum current value, for example, 20 micro-ampere (μA). Accordingly, power consumption of the clamp logic circuit 200 is smaller than that of the logic circuit 100.

Figure 3:
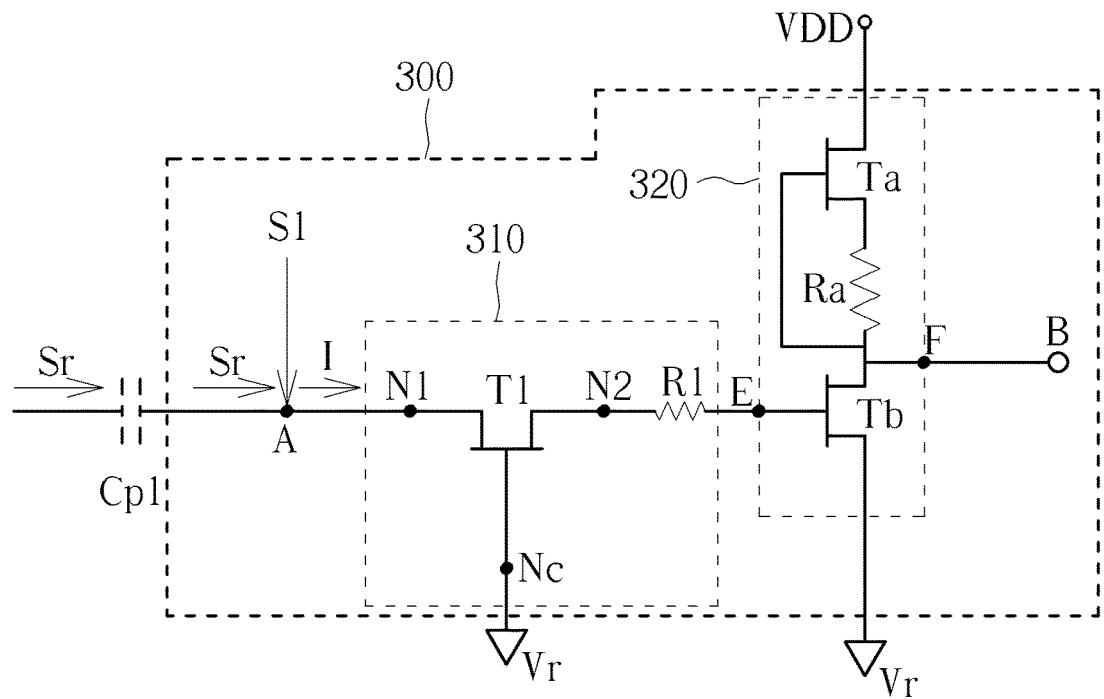
FIG. 3 is a circuit diagram of a clamp logic circuit according to another embodiment of the present invention.

Please refer to FIG. 3. FIG. 3 is a circuit diagram of a clamp logic circuit 300 according to another embodiment of the present invention. The clamp logic circuit 300 comprises a logic circuit 320, a control terminal A, a current clamp circuit 310 and an output terminal B. An input end E of the logic circuit 320 is coupled to the current clamp circuit 310, and an output end F of the logic circuit 320 is coupled to the output terminal B of the clamp logic circuit 300. The logic circuit 320 may be an inverter and may comprise at least a junction field-effect transistor (JFET). In the embodiment, the logic circuit 320 comprises a resistor Ra and a plurality of JFETs Ta and Tb. A first end of the JFET Ta may be coupled to a reference voltage VDD, a second end of the JFET Ta may be coupled to a first end of the resistor Ra, and a control end of the JFET Ta may be coupled to a second end of the resistor Ra and the output end F of the logic circuit 320. A first end of the JFET Tb may be coupled to the second end of the resistor Ra and the output end F of the logic circuit 320, a second end of the JFET Tb may be coupled to a reference voltage Vr, and a control end of the JFET Tb may be coupled to the input end E of the logic circuit 320. The reference voltage VDD may be a variable voltage, and the reference voltage Vr may be a constant voltage. For example, the reference voltage VDD may be a supply voltage, and the reference voltage Vr may be a ground voltage. In an embodiment of the present invention, the JFETs Ta and Tb may be pseudomorphic high-electron-mobility transistors (pHEMTs). In another embodiment of the present invention, the JFET Ta may be a depletion-mode (D-mode) field-effect transistor (FET), and the JFET Tb may be an enhancement-mode (E-mode) field-effect transistor (FET).

The current clamp circuit 310 is also used to clamp the current I flowing from the control terminal A into the current clamp circuit 310. The current clamp circuit 310 comprises a transistor T1 and a resistor R1. A first end N1 of the transistor T1 is coupled to the control terminal A, a second end N2 of the transistor T1 is coupled to a first end of the resistor R1, a control end Nc of the transistor T1 is coupled to the reference voltage Vr, and a second end of the resistor R1 is coupled to the input end E of the logic circuit 320. The transistor T1 may be a D-mode FET and has a negative threshold voltage (i.e., a threshold voltage less than 0 volts (e.g., −1 volts)). In the case of high frequency analysis, when the signal strength of the external AC signal Sr is greater than the threshold voltage of the transistor T1, the external AC signal Sr will be transmitted from the first end N1 to the second end N2, and the external AC signal Sr will not be distorted. However, when the signal strength of the external AC signal Sr is less than the threshold voltage of the transistor T1, the external AC signal Sr Will be intercepted, causing distortion of the external AC signal Sr. In another embodiment, the transistor T1 may be an E-mode FET.

Figure 4:
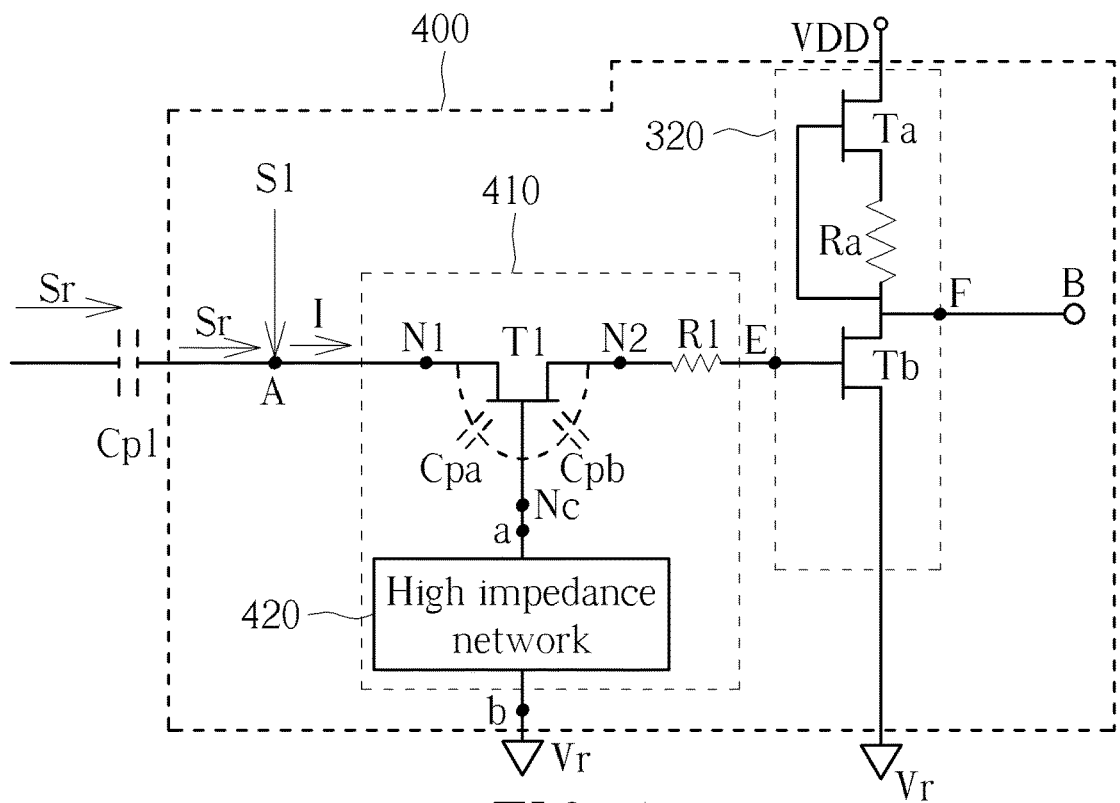
FIG. 4 is a circuit diagram of a clamp logic circuit according to another embodiment of the present invention.

Please refer to FIG. 4. FIG. 4 is a circuit diagram of a clamp logic circuit 400 according to another embodiment of the present invention. In the embodiment, the clamp logic circuit 400 is similar to the clamp logic circuit 300. The main difference between the clamp logic circuits 300 and 400 is that a current clamp circuit 410 of the clamp logic circuit 400 comprises not only the transistor T1 and the resistor R1 but also a high impedance network 420. The high impedance network 420 is coupled between the control end Nc of the transistor T1 and the reference voltage Vr. The high impedance network 420 provides high impedance between the control end Nc and the reference voltage Vr so as to increase the linearity of the transistor T1. For example, the high impedance network 420 may have a resistance of 50K ohms. Moreover, as shown in FIG. 4, a parasitic capacitor Cpa may exist between the first end N1 and the control end Nc, and another parasitic capacitor Cpb may exist between the second end N2 and the control end Nc. An AC signal transmission path between the first end N1 and the second end N2 is formed due to the parasitic capacitors Cpa and Cpb. Therefore, distortion of the external AC signal Sr caused by the transistor T1 would be reduced and integrity of the external AC signal Sr would be maintained.

Figure 5A:
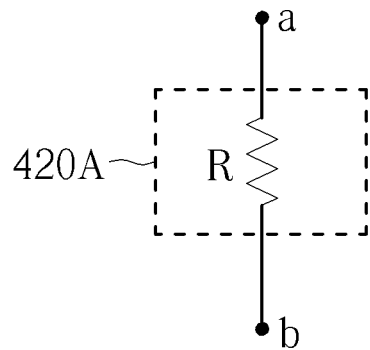
FIG. 5A to FIG. 5C are circuit diagrams of high impedance networks of the current clamp circuit of the clamp logic circuit according to different embodiments of the present invention.
Figure 5B:
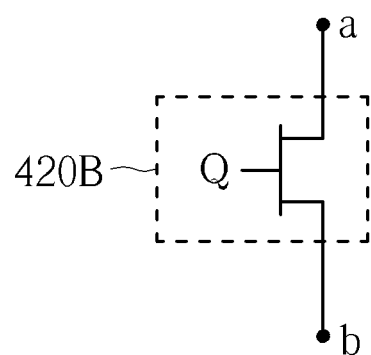
Figure 5C:
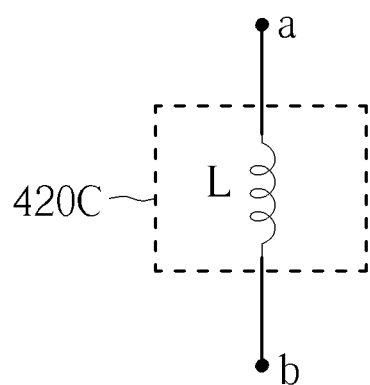

As shown in FIG. 4, the high impedance network 420 of the clamp logic circuit 400 has two ends a and b. More specifically, the end a of the high impedance network 420 is coupled to the control end Nc of the transistor T1, and the end b of the high impedance network 420 is coupled to the reference voltage Vr. In an embodiment of the present invention, the high impedance network 420 may be implemented by a high impedance network 420A illustrated in FIG. 5A, which comprises a resistor R. In another embodiment of the present invention, the high impedance network 420 may be implemented by a high impedance network 420B illustrated in FIG. 5B, which comprises a transistor Q. In another embodiment of the present invention, the high impedance network 420 may be implemented by a high impedance network 420C illustrated in FIG. 5C, which comprises an inductor L.

Figure 6A:
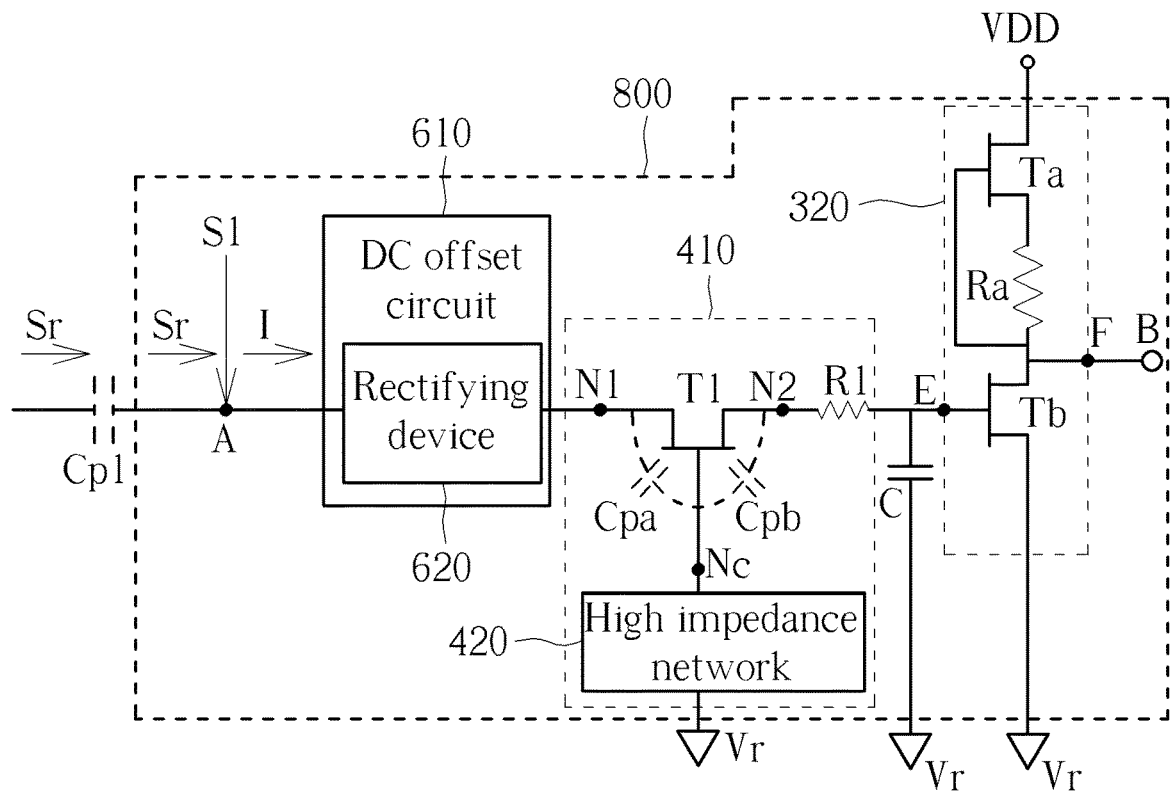
FIG. 6A to FIG. 6C are circuit diagrams of the clamp logic circuit according to different embodiments of the present invention.

Please refer to FIG. 6A. FIG. 6A is a circuit diagram of a clamp logic circuit 800 according to another embodiment of the present invention. In the embodiment, the clamp logic circuit 800 is similar to the clamp logic circuit 400 shown in FIG. 4. The main difference between the clamp logic circuits 400 and 800 is that the clamp logic circuit 800 further comprises a DC offset circuit 610 and a capacitor C. The DC offset circuit 610 is coupled between the control terminal A and the first end N1 of the transistor T1. The DC offset circuit 610 is configured to adjust the DC voltage level of the DC input signal S1 (e.g., adjust the DC voltage level of the DC input signal S1 according to the threshold value of the logic circuit 320). The DC offset circuit 610 comprises a rectifying device 620. A first end of the rectifying device 620 is coupled to the control terminal A, and a second end of the rectifying device 620 is coupled to the first end N1 of the transistor T1. In addition, a first end of the capacitor C is coupled between the input end E of the logic circuit 320 and the second end of the resistor R1, and a second end of the capacitor C is coupled to the reference voltage Vr. The resistor R1 and the capacitor C form a low pass filter that allows the input signal S1 to pass through and is configured to filter out the external AC signal Sr. In another embodiment of the present invention, the clamp logic circuit 800 may further comprise an inductor coupled between the second end of the resistor R1 and the first end of the capacitor C. The resistor R1, the capacitor C and the inductor form a low pass filter that allows the input signal S1 to pass through and is configured to filter out the external AC signal Sr. Due to the existence of the high impedance network 420, distortion of the external AC signal Sr caused by the transistor T1 would be reduced and integrity of the external AC signal Sr would be maintained, so that the external AC signal Sr could be substantially filtered out (e.g., the external AC signal Sr can be removed) by the low pass filter. As a result, effect of the external AC signal Sr on the DC voltage level of the input end E of the logic circuit 320 may be reduced, such that the transition of the logic level of the output end F of the logic circuit 320 would be normal. Accordingly, the transition of the logic level of the output terminal B of the clamp logic circuit 800 would be normal. In another embodiment, the DC offset circuit 610 may be omitted based on different design choices of the clamp logic circuit 800.

Figure 6B:
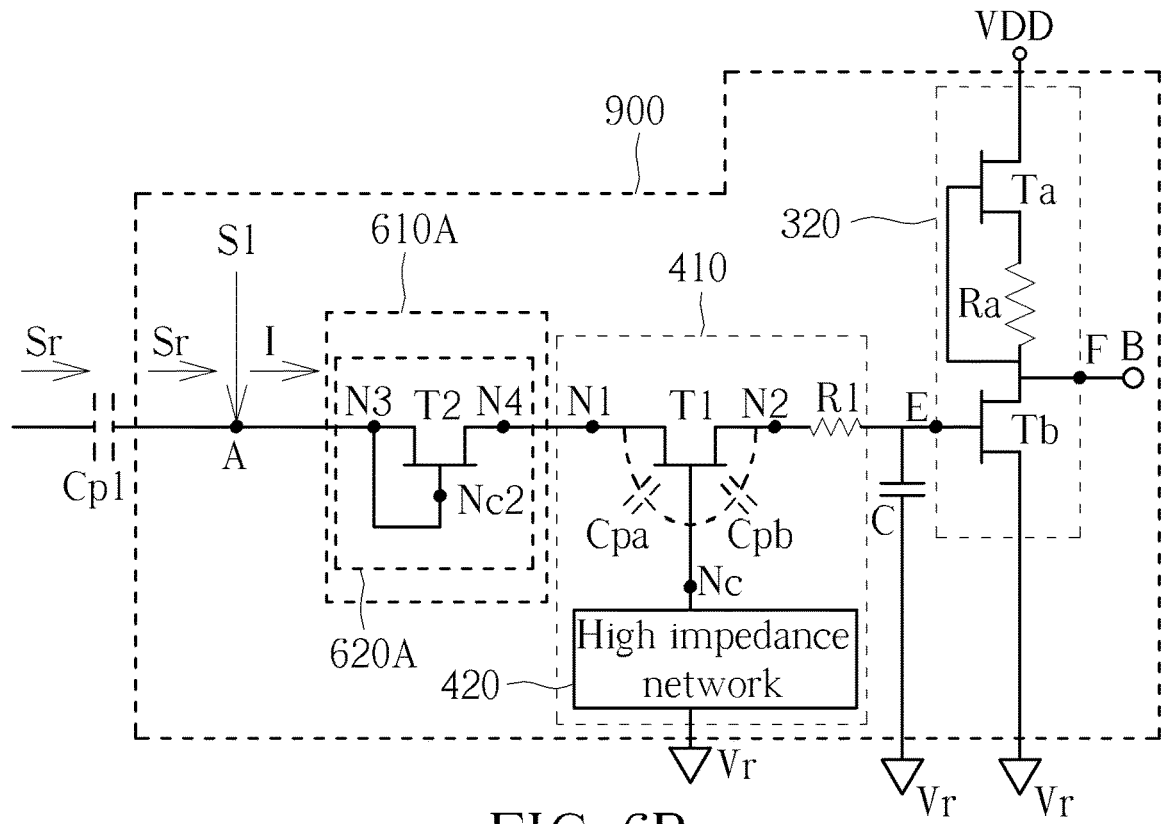

Please refer to FIG. 6B. FIG. 6B is a circuit diagram of a clamp logic circuit 900 according to another embodiment of the present invention. In the embodiment, the clamp logic circuit 900 is similar to the clamp logic circuit 800 shown in FIG. 6A. The DC offset circuit 610 of the clamp logic circuit 800 is implemented by a DC offset circuit 610A of the clamp logic circuit 900. The DC offset circuit 610A comprises a rectifying device 620A coupled between the control terminal A and the first end N1 of the transistor T1. The rectifying device 620A of the DC offset circuit 610A comprises a diode-connected transistor T2. A first end N3 and a control end Nc2 of the diode-connected transistor T2 are coupled to each other and are coupled to the control terminal A, and a second end N4 of the diode-connected transistor T2 is coupled to the first end N1 of the transistor T1. The diode-connected transistor T2 may be an E-mode FET.

Figure 6C:
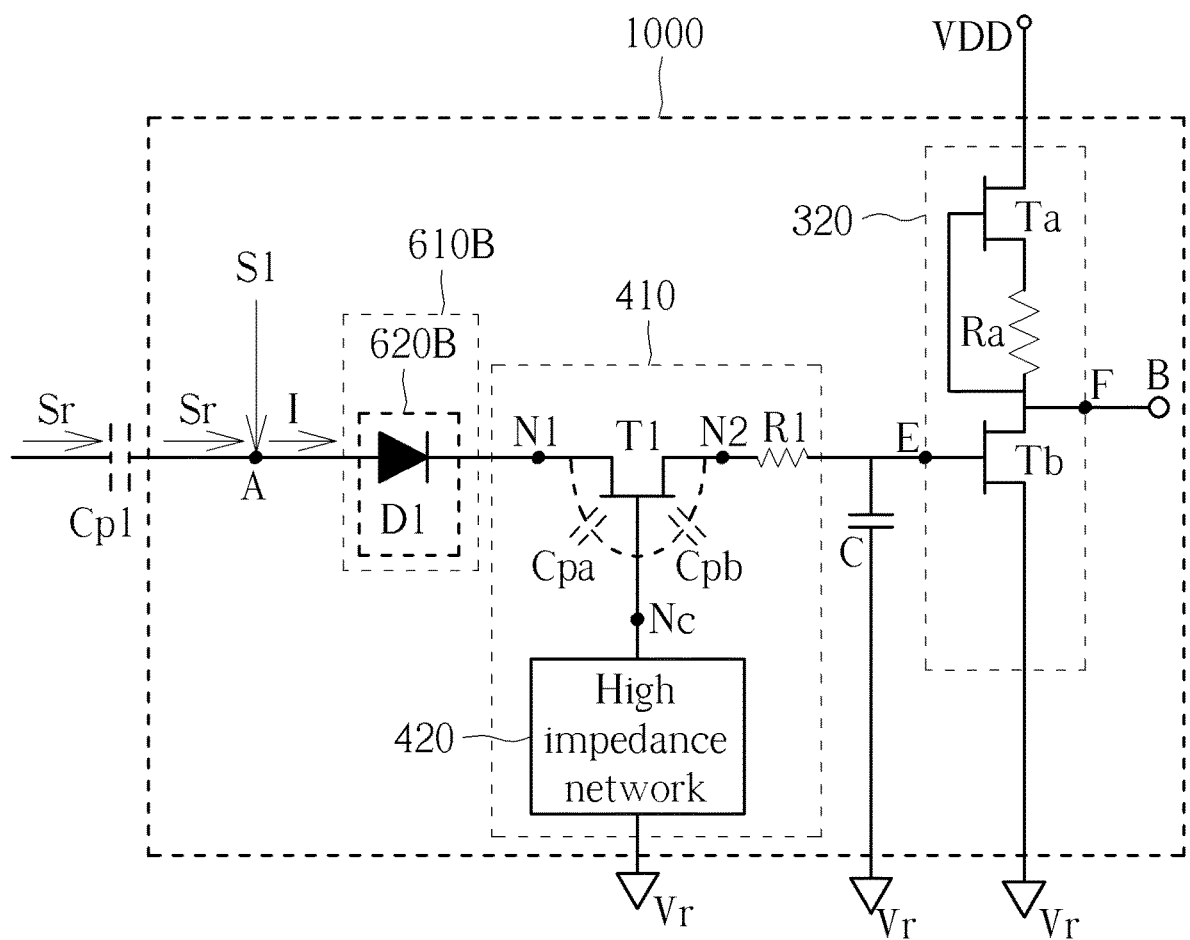

Please refer to FIG. 6C. FIG. 6C is a circuit diagram of a clamp logic circuit 1000 according to another embodiment of the present invention. In the embodiment, the clamp logic circuit 1000 is similar to the clamp logic circuit 800 shown in FIG. 6A. The DC offset circuit 610 of the clamp logic circuit 800 is implemented by a DC offset circuit 610B of the clamp logic circuit 1000. The DC offset circuit 610B comprises a rectifying device 620B coupled between the control terminal A and the first end N1 of the transistor T1. The rectifying device 620B of the DC offset circuit 610B comprises a first diode D1. A first end (i.e., an anode) of the first diode D1 is coupled to the control terminal A, and a second end (i.e., a cathode) of the first diode D1 is coupled to the first end N1 of the transistor T1.

Figure 7A:
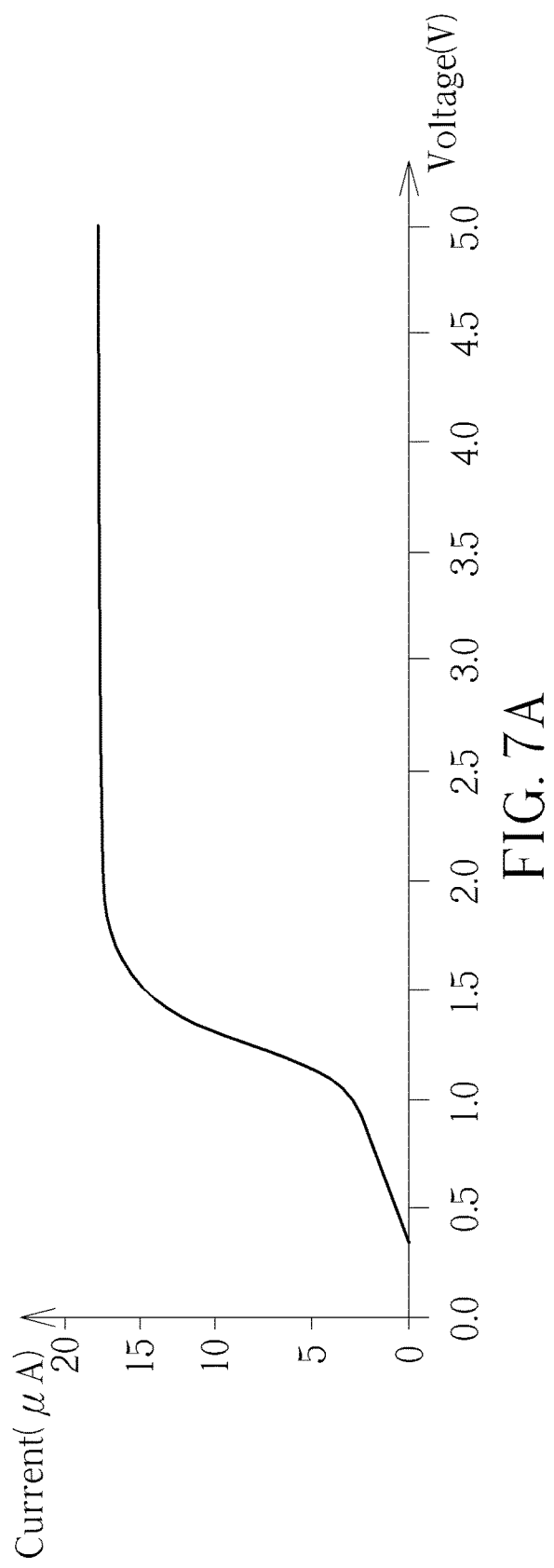
FIG. 7A is a relationship diagram of a current flowing from the control terminal into the current clamp circuit of the clamp logic circuit shown in FIG. 6B versus a voltage level of the input signal.
Figure 7B:
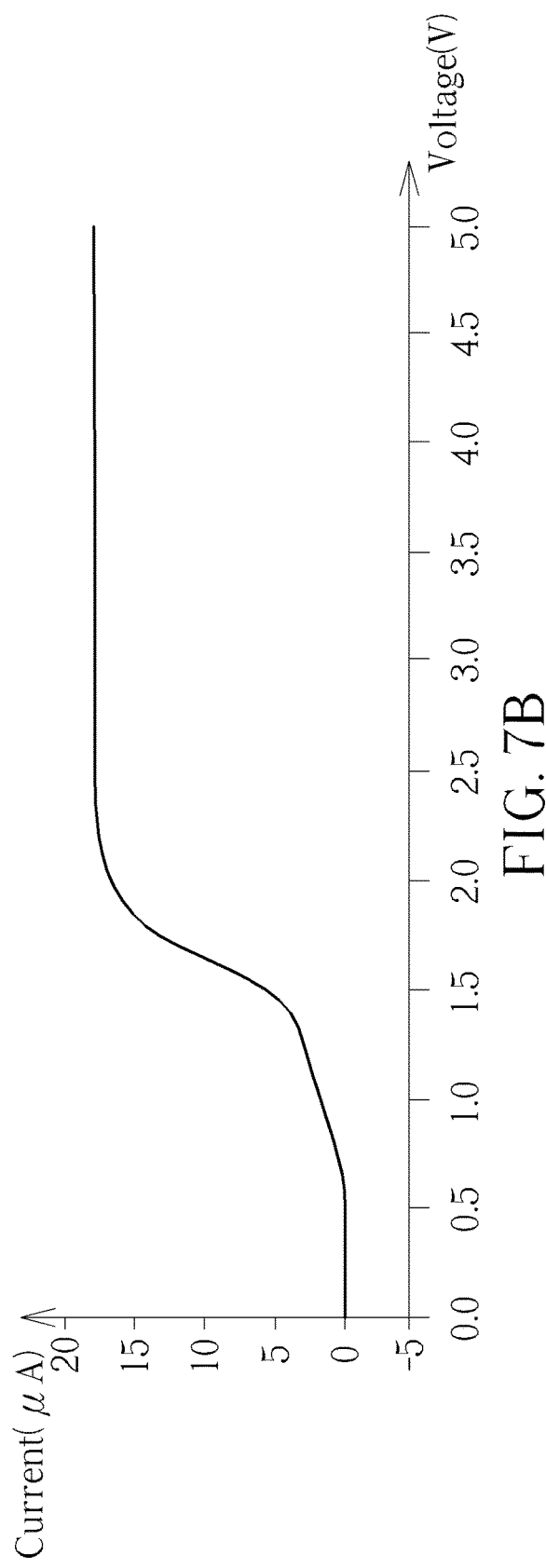
FIG. 7B is a relationship diagram of a current flowing from the control terminal into the current clamp circuit of the clamp logic circuit shown in FIG. 6C versus a voltage level of the input signal.

Please refer to FIG. 2B and FIGS. 7A to 7B. FIG. 7A is a relationship diagram of a current I flowing from the control terminal A into the current clamp circuit 410 of the clamp logic circuit 900 shown in FIG. 6B versus a voltage level of the input signal S1. FIG. 7B is a relationship diagram of a current I flowing from the control terminal A into the current clamp circuit 410 of the clamp logic circuit 1000 shown in FIG. 6C versus a voltage level of the input signal S1. As shown in FIG. 2B, the current I flowing from the control terminal A into the current clamp circuit 210 of the clamp logic circuit 200, for example, may be greater than 0 μA as long as the voltage level of the input signal S1 is greater than 0V. As shown in FIG. 7A, due to the DC offset circuit 610A, the current flowing from the control terminal A into the current clamp circuit 410 of the clamp logic circuit 900, for example, may be greater than 0 μA as long as the voltage level of the input signal S1 is greater than 0.3V. As shown in FIG. 7B, due to the DC offset circuit 610B, the current flowing from the control terminal A into the current clamp circuit 410 of the clamp logic circuit 1000, for example, may be greater than 0 μA as long as the voltage level of the input signal S1 is greater than 0.5V.

Figure 8:
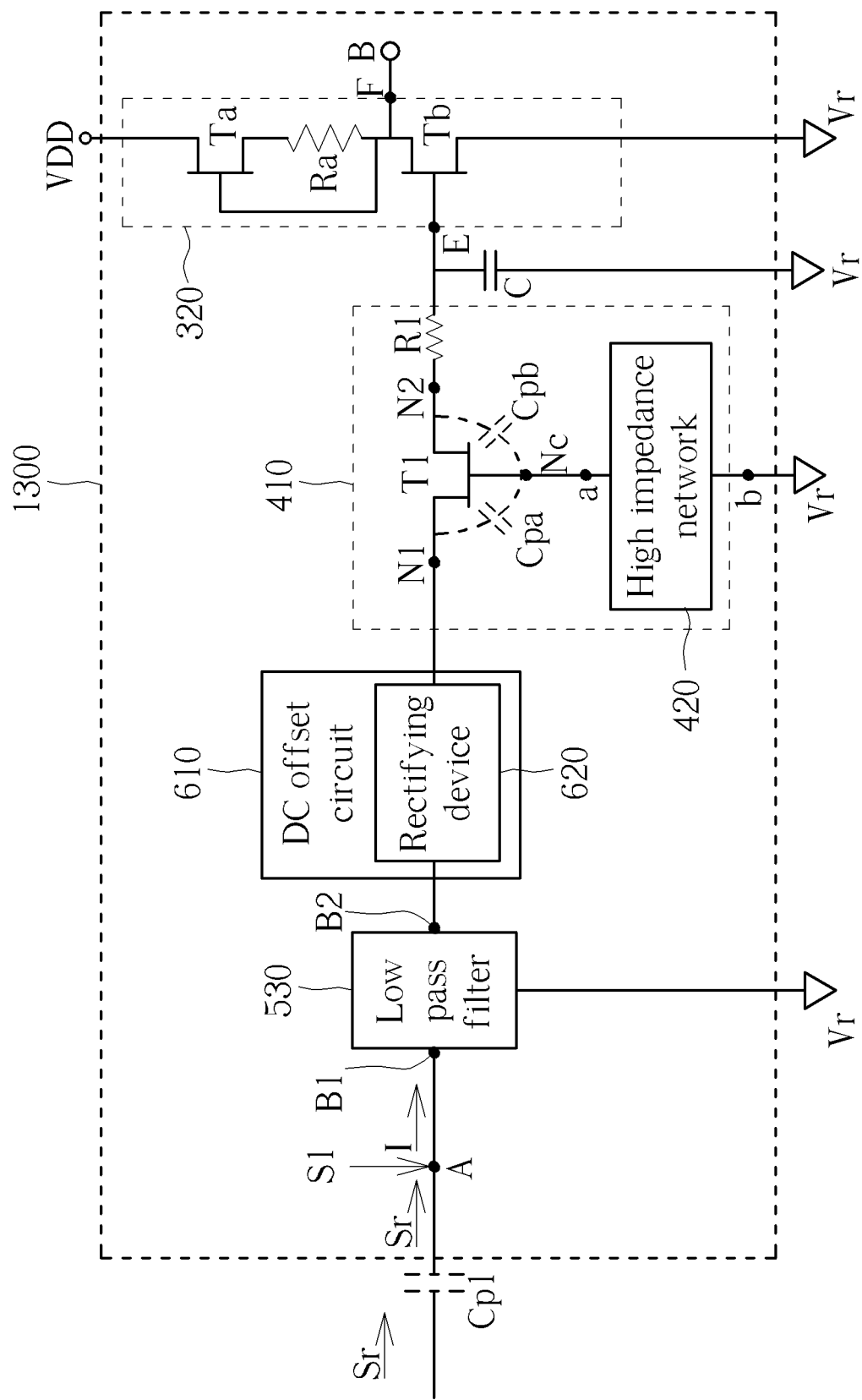
FIG. 8 is circuit diagram of the clamp logic circuit according to another embodiment of the present invention.

Please refer to FIG. 8. FIG. 8 is a circuit diagram of a clamp logic circuit 1300 according to another embodiment of the present invention. In the embodiment, the clamp logic circuit 1300 is similar to the clamp logic circuit 800 shown in FIG. 6A. The main difference between the clamp logic circuits 800 and 1300 is that the clamp logic circuit 1300 further comprises the low pass filter 530. The low pass filter 530 is coupled between the control terminal A and the DC offset circuit 610. More specifically, a first end B1 of the low pass filter 530 is coupled to the control terminal A, and a second end B2 of the low pass filter 530 is coupled to the DC offset circuit 610. The low pass filter 530 is used to adjust the amplitude of the external AC signal Sr. To reduce the effect of the external AC signal Sr having a greater amplitude, the low pass filter 530 can be added in to provide an auxiliary filtering function to filter out the external AC signal Sr, so as to reduce the amplitude of the external AC signal Sr.

Figure 9A:
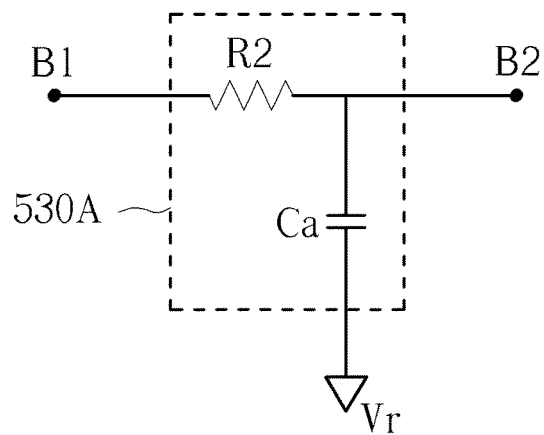
FIG. 9A to FIG. 9C are circuit diagrams of the low pass filter of the clamp logic circuit according to different embodiments of the present invention.
Figure 9B:
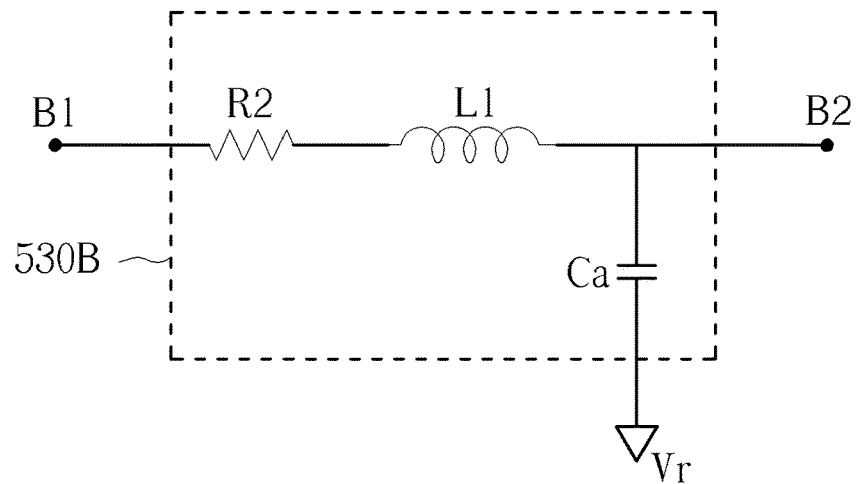
Figure 9C:
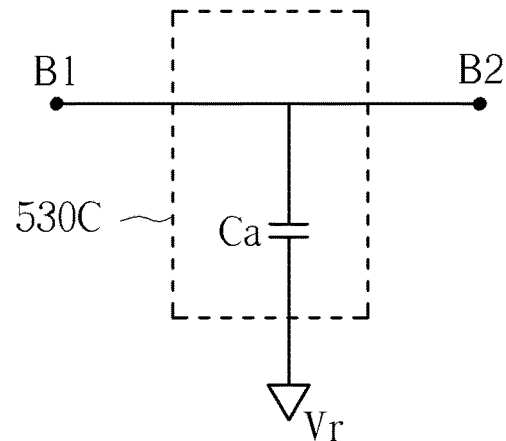

In an embodiment of the present invention, the low pass filter 530 shown in FIG. 8 may be implemented by a low pass filter 530A illustrated in FIG. 9A, which comprises a resistor R2 and a capacitor Ca. A first end of the resistor R2 is coupled to the first end B1 of the low pass filter 530A, a second end of the resistor R2 is coupled to the second end B2 of the low pass filter 530A and a first end of the capacitor Ca, and a second end of the capacitor Ca is coupled to the reference voltage Vr. In another embodiment of the present invention, the low pass filter 530 shown in FIG. 8 may be implemented by a low pass filter 530B illustrated in FIG. 9B, which comprises the resistor R2, an inductor L1 and the capacitor Ca. The first end of the resistor R2 is coupled to the first end B1 of the low pass filter 530B, the second end of the resistor R2 is coupled to a first end of the inductor L1, a second end of the inductor L1 is coupled to the second end B2 of the low pass filter 530B and the first end of the capacitor Ca, and the second end of the capacitor Ca is coupled to the reference voltage Vr. In another embodiment of the present invention, the low pass filter 530 shown in FIG. 8 may be implemented by a low pass filter 530C illustrated in FIG. 9C, which comprises the capacitor Ca. The first end of the capacitor Ca is coupled to the first end B1 and the second end B2 of the low pass filter 530C, and the second end of the capacitor Ca is coupled to the reference voltage Vr.

Figure 10A:
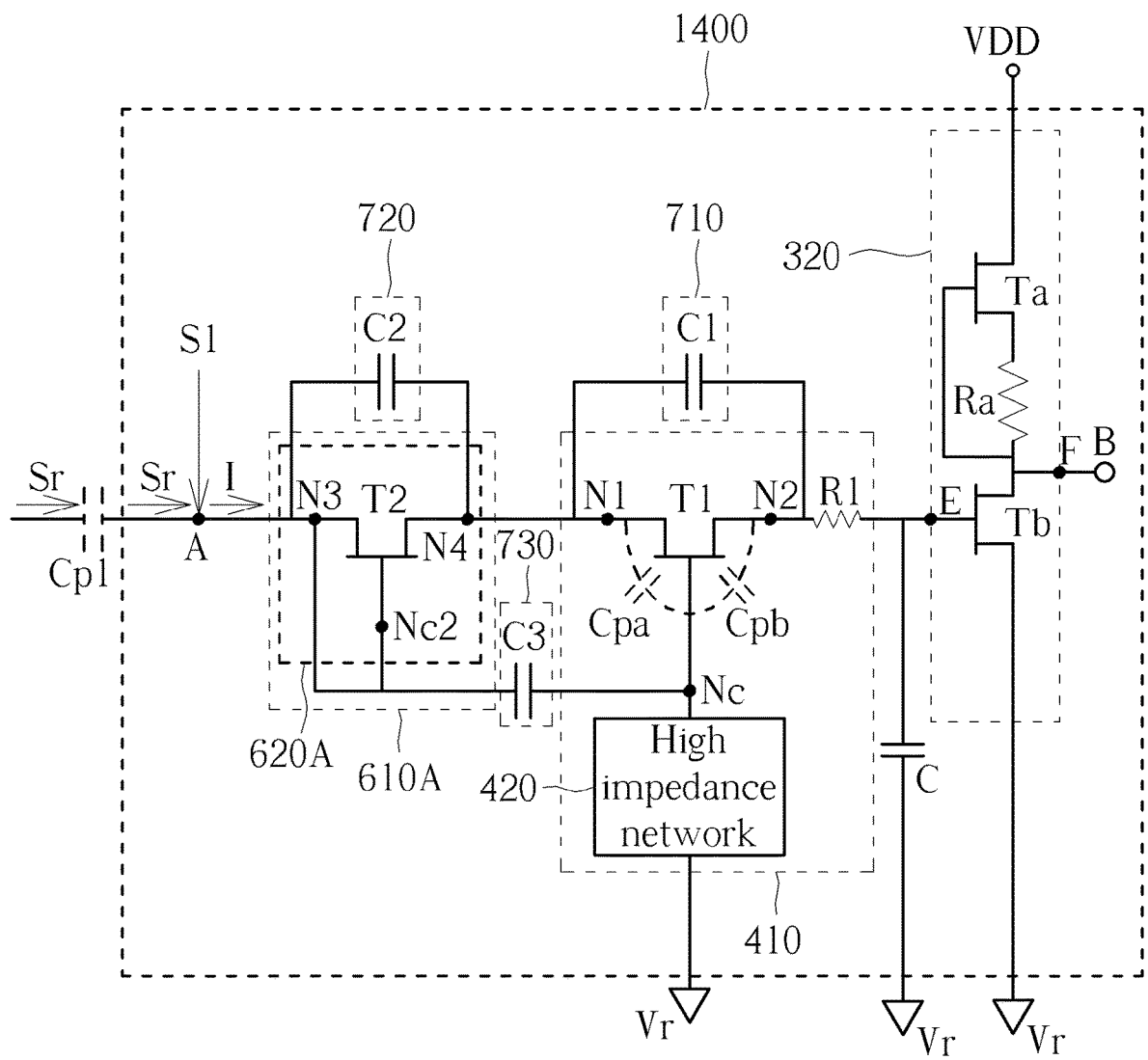
FIG. 10A to FIG. 10C are circuit diagrams of the clamp logic circuit according to different embodiments of the present invention.

Please refer to FIG. 10A. FIG. 10A is a circuit diagram of a clamp logic circuit 1400 according to another embodiment of the present invention. In the embodiment, the clamp logic circuit 1400 is similar to the clamp logic circuit 900 shown in FIG. 6B. The main difference between the clamp logic circuits 900 and 1400 is that the clamp logic circuit 1400 further comprises at least one of high pass filters 710, 720 and 730. In other words, the clamp logic circuit 1400 may further comprise one, two or all of the high pass filters 710, 720 and 730 based on different design choices of the clamp logic circuit 1400. The high pass filter 710 is coupled between the first end N1 and the second end N2 of the transistor T1, the high pass filter 720 is coupled between the first end N3 and the second end N4 of the diode-connected transistor T2, and the high pass filter 730 is coupled between the control end Nc of the transistor T1 and the control end Nc2 of the diode-connected transistor T2. In the embodiment, for the external AC signal Sr, the high pass filter 710 provides a low impedance path from the first end N1 of the transistor T1 through the high pass filter 710 to the second end N2 of the transistor T1, the high pass filter 720 provides a low impedance path from the first end N3 of the diode-connected transistor T2 through the high pass filter 720 to the second end N4 of the diode-connected transistor T2, and the high pass filter 730 provides a low impedance path from the first end N3 of the diode-connected transistor T2 through the high pass filter 730 to the control end Nc of the transistor T1. Since each of the high pass filters 710, 720 and 730 may provide a low impedance path for the external AC signal Sr, effect of the non-linearity of the transistors T1 and the diode-connected transistor T2 on the external AC signal Sr would be reduced. Accordingly, distortion of the external AC signal Sr would be decreased, and integrity of the external AC signal Sr would be maintained. More specifically, the external AC signal Sr could be substantially filtered out (e.g., the external AC signal Sr can be removed) by the low pass filter. As a result, effect of the external AC signal Sr on the DC voltage level of the input end E of the logic circuit 320 may be reduced, such that the transition of the logic level of the output terminal B would be normal. In addition, each of the high pass filters 710, 720 and 730 may also provide a bi-directional conducting path (e.g. a voltage path of positive half period of the external AC signal Sr and a voltage path of negative half period of the external AC signal Sr), which is helpful to reduce distortion of the external AC signal Sr. The high pass filter 710 may be a capacitor C1, the high pass filter 720 may be a capacitor C2, or the high pass filter 730 may be a capacitor C3.

Figure 10B:
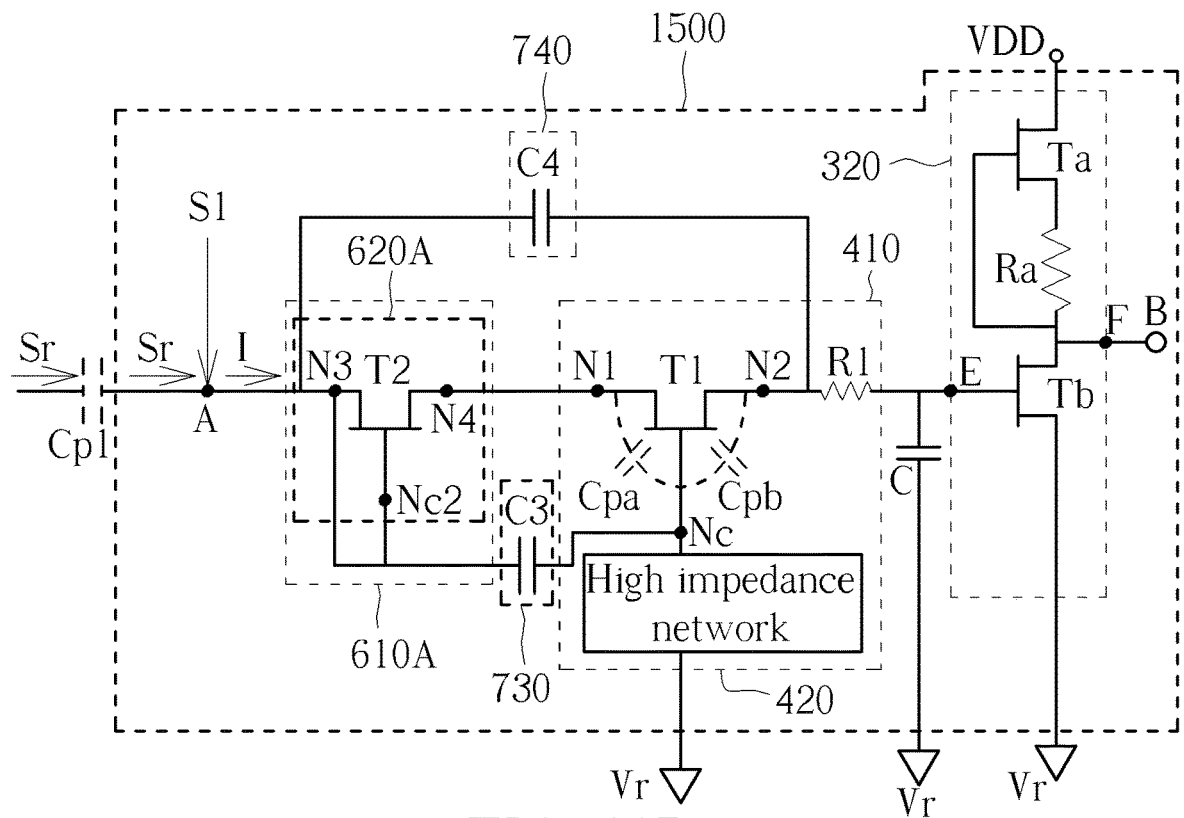

Please refer to FIG. 10B. FIG. 10B is a circuit diagram of a clamp logic circuit 1500 according to another embodiment of the present invention. In the embodiment, the clamp logic circuit 1500 is similar to the clamp logic circuit 900 shown in FIG. 6B. The main difference between the clamp logic circuits 900 and 1500 is that the clamp logic circuit 1500 further comprises at least one of high pass filters 730 and 740. In other words, the clamp logic circuit 1500 may further comprise one or all of the high pass filters 730 and 740 based on different design choices of the clamp logic circuit 1500. The high pass filter 730 is coupled between the control end Nc of the transistor T1 and the control end Nc2 of the diode-connected transistor T2, and the high pass filter 740 is coupled between the control terminal A and the second end N2 of the transistor T1. In the embodiment, for the external AC signal Sr, the high pass filter 730 provides a low impedance path from the first end N3 of the diode-connected transistor T2 through the high pass filter 730 to the control end Nc of the transistor T1, and the high pass filter 740 provides a low impedance path from the first end N3 of the diode-connected transistor T2 through the high pass filter 740 to the second end N2 of the transistor T1. Therefore, effect of the non-linearity of the transistors T1 and the diode-connected transistor T2 on the external AC signal Sr would be reduced. Accordingly, distortion of the external AC signal Sr would be decreased, and integrity of the external AC signal Sr would be maintained. Each of the high pass filters 730 and 740 may also provide a bi-directional conducting path, which is helpful to reduce distortion of the external AC signal Sr. The high pass filter 730 may be a capacitor C3 or the high pass filter 740 may be a capacitor C4.

Figure 10C:
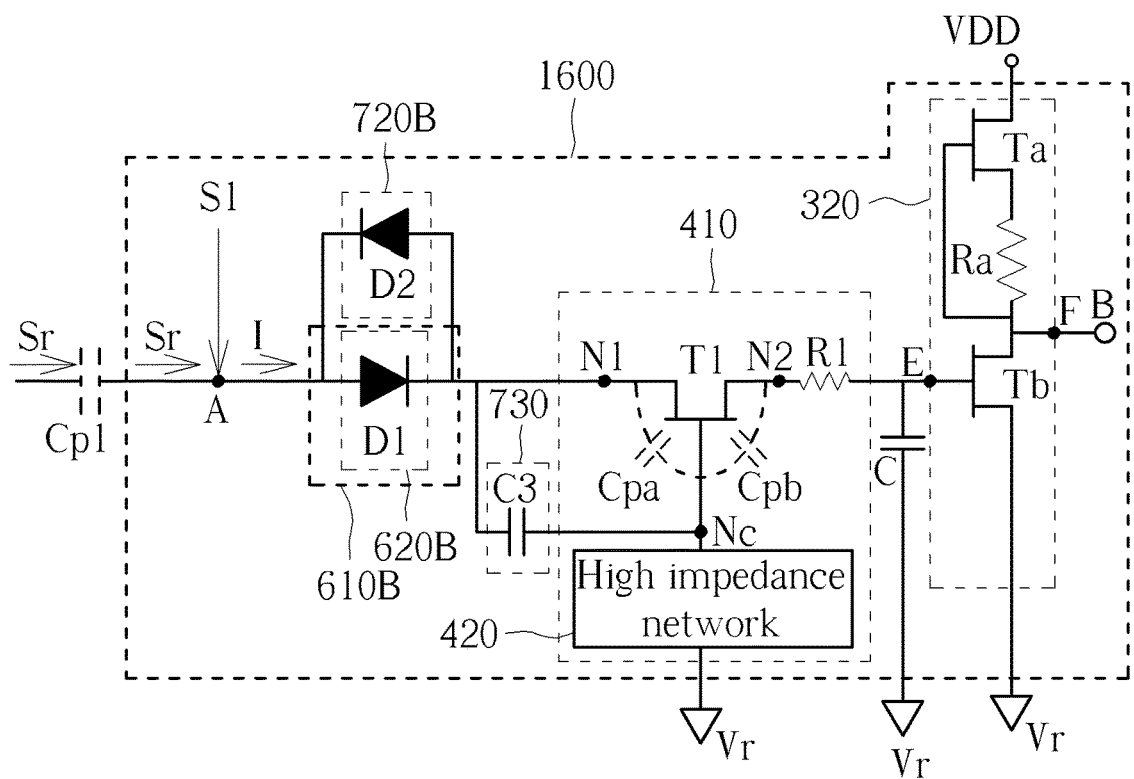

Please refer to FIG. 10C. FIG. 10C is a circuit diagram of a clamp logic circuit 1600 according to another embodiment of the present invention. In the embodiment, the clamp logic circuit 1600 is similar to the clamp logic circuit 1000 shown in FIG. 6C. The main difference between the clamp logic circuits 1000 and 1600 is that the clamp logic circuit 1600 further comprises another rectifying device 720B and a high pass filter 730. A first end of the rectifying device 720B is coupled to the second end of the rectifying device 620B, and a second end of the rectifying device 720B is coupled to the first end of the rectifying device 620B. The rectifying device 720B comprises a second diode D2. A first end (i.e., an anode) of the second diode D2 is coupled to the second end (i.e., a cathode) of first diode D1, and a second end (i.e., a cathode) of the second diode D2 is coupled to the first end (i.e., an anode) of first diode D1. The two rectifying devices 620B and 720B provide a bi-directional conducting path (e.g. a voltage path of positive half period of the external AC signal Sr and a voltage path of negative half period of the external AC signal Sr) between the control terminal A and the first end N1 of the transistor T1, and the two rectifying devices 620B and 720B are helpful to reduce distortion of the external AC signal Sr. The high pass filter 730 is coupled between the control end Nc of the transistor T1 and the second end (i.e., the cathode) of the diode D1 to provide a low impedance path from the second end (i.e., the cathode) of the first diode D1 and the first end (i.e., the anode) of the second diode D2 through the high pass filter 730 to the control end Nc of the transistor T1. Therefore, effect of the non-linearity of the transistor T1 on the external AC signal Sr would be reduced. As a result, distortion of the external AC signal Sr would be decreased, and integrity of the external AC signal Sr would be maintained. The high pass filter 730 may be a capacitor C3. In another embodiment, the rectifying device 720B may comprise a diode-connected transistor. In yet another embodiment, the high pass filter 730 may be omitted based on different design choices of the clamp logic circuit 1600.

In some embodiments of the present invention, all of the transistors (e.g., T1, T2, Ta and Tb) of the clamp logic circuit may be gallium arsenide (GaAs) transistors or gallium nitride (GaN) transistors.

The clamp logic circuits according to the embodiments of the present invention use the current clamp circuits to limit a maximum current flowing from the control terminal into the current clamp circuit of the clamp logic circuit to reduce the power consumption. The current clamp circuits of the clamp logic circuits may comprise a high impedance network to provide high impedance between the control end of the transistor and the reference voltage so as to increased linearity of the transistor of the current clamp circuits. Accordingly, distortion of the external AC signal would be reduced, and integrity of the external AC signal would be maintained. In addition, by using the capacitor and the resistor of the current clamp circuits, a low pass filter could be formed to filter out the external AC signal. As a result, effect of the external AC signal on the DC voltage level of the input end of the logic circuit may be reduced, such that the transition of the logic level of the output terminal of the clamp logic circuit (i.e., the transition of the logic level of the output end of the clamp logic circuit) would be normal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clamp logic circuit, comprising:
a logic circuit, comprising at least a junction field-effect transistor (JFET);
a control terminal, configured to receive an input signal;
a current clamp circuit, configured to limit a maximum of
a current flowing from the control terminal into the current clamp circuit to be less than a predetermined value when an external alternating current (AC) signal is transmitted to the control terminal, the current clamp circuit comprising a first transistor and a first resistor, a first end of the first transistor being coupled to the control terminal, a second end of the first transistor being coupled to a first end of the first resistor, a control end of the first transistor being coupled to a reference voltage, and a second end of the first resistor being coupled to an input end of the logic circuit; and an output terminal, coupled to an output end of the logic circuit.

2. The clamp logic circuit of claim 1, wherein the current clamp circuit further comprises a high impedance network coupled between the control end of the first transistor and the reference voltage, and the high impedance network comprises a resistor, a transistor or an inductor.

3. The clamp logic circuit of claim 1, wherein the logic circuit comprises an inverter.

4. The clamp logic circuit of claim 1, wherein the at least a JFET comprises a plurality of JFETs, and the plurality of JFETs are a plurality of pseudomorphic high-electron-mobility transistors (pHEMTs).

5. The clamp logic circuit of claim 1, wherein the first transistor is a depletion-mode (D-mode) field-effect transistor (FET).

6. The clamp logic circuit of claim 2 further comprising a first capacitor, a first end of the first capacitor being coupled to the input end of the logic circuit and the second end of the first resistor, a second end of the first capacitor being coupled to the reference voltage, and the first capacitor and the first resistor forming a low pass filter.

7. The clamp logic circuit of claim 3, wherein the at least a JFET comprises an enhancement-mode (E-mode) field-effect transistor (FET) and a depletion-mode (D-mode) field-effect transistor (FET).

8. The clamp logic circuit of claim 6 further comprising a direct current (DC) offset circuit coupled between the control terminal and the first end of the first transistor.

9. The clamp logic circuit of claim 8, wherein the DC offset circuit comprises a first rectifying device, a first end of the first rectifying device is coupled to the control terminal, and a second end of the first rectifying device is coupled to the first end of the first transistor.

10. The clamp logic circuit of claim 8 further comprising a low pass filter coupled between the control terminal and the DC offset circuit.

11. The clamp logic circuit of claim 9, wherein the first rectifying device comprises a diode-connected transistor, a first end and a control end of the diode-connected transistor are coupled to each other and are coupled to the control terminal, and a second end of the diode-connected transistor is coupled to the first end of the first transistor.

12. The clamp logic circuit of claim 9, wherein the first rectifying device comprises a first diode, a first end of the first diode is coupled to the control terminal, and a second end of the first diode is coupled to the first end of the first transistor.

13. The clamp logic circuit of claim 9 further comprising a second rectifying device, a first end of the second rectifying device being coupled to the second end of the first rectifying device, and a second end of the second rectifying device being coupled to the first end of the first rectifying device, wherein the second rectifying device and the first rectifying device provide a bi-directional conducting path between the control terminal of the clamp logic circuit and the first end of the first transistor.

14. The clamp logic circuit of claim 11 further comprising at least one of a first high pass filter, a second high pass filter and a third high pass filter, wherein the first high pass filter is coupled between the first end of the first transistor and the second end of the first transistor, the second high pass filter is coupled between the first end of the diode-connected transistor and the second end of the diode-connected transistor, and the third high pass filter is coupled between the control end of the first transistor and the control end of the diode-connected transistor.

15. The clamp logic circuit of claim 11 further comprising at least one of a first high pass filter and a second high pass filter, wherein the first high pass filter is coupled between the control terminal of the clamp logic circuit and the second end of the first transistor, and the second high pass filter is coupled between the control end of the first transistor and the control end of the diode-connected transistor.

16. The clamp logic circuit of claim 12 further comprising a second rectifying device, wherein the second rectifying device comprises a second diode, a first end of the second diode is coupled to the second end of the first diode, and a second end of the second diode is coupled to the first end of the first diode.

17. The clamp logic circuit of claim 13 further comprising a first high pass filter, wherein the first high pass filter is coupled between the control end of the first transistor and the second end of the first rectifying device.

18. The clamp logic circuit of claim 14, wherein the first high pass filter comprises a second capacitor, the second high pass filter comprises a third capacitor or the third high pass filter comprises a fourth capacitor.

19. The clamp logic circuit of claim 15, wherein the first high pass filter comprises a second capacitor or the second high pass filter comprises a third capacitor.

20. The clamp logic circuit of claim 17, wherein the first high pass filter comprises a second capacitor.

* * * * *